US008232707B2

(12) United States Patent
Furuhata et al.

(10) Patent No.: US 8,232,707 B2
(45) Date of Patent: Jul. 31, 2012

(54) FLEXURAL VIBRATION PIECE AND OSCILLATOR USING THE SAME

(75) Inventors: Makoto Furuhata, Matsumoto (JP); Takashi Yamazaki, Shiojiri (JP); Yuji Hamayama, Tokai (JP)

(73) Assignee: Seiko Epson Corporation, Tokyo (JP)

( * ) Notice: Subject to any disclaimer, the term of this patent is extended or adjusted under 35 U.S.C. 154(b) by 211 days.

(21) Appl. No.: 12/729,481

(22) Filed: Mar. 23, 2010

(65) Prior Publication Data

US 2010/0244973 A1  Sep. 30, 2010

(30) Foreign Application Priority Data

Mar. 25, 2009 (JP) ................................ 2009-073740
Jan. 8, 2010 (JP) ................................ 2010-002670

(51) Int. Cl.
*H01L 41/04* (2006.01)
(52) U.S. Cl. ....................... 310/346; 310/370
(58) Field of Classification Search .............. 310/346, 310/370
See application file for complete search history.

(56) References Cited

U.S. PATENT DOCUMENTS

| 6,587,009 | B2 | 7/2003 | Kitamura et al. |
| 8,067,880 | B2 | 11/2011 | Yamada |
| 8,134,283 | B2 | 3/2012 | Yamada et al. |
| 2010/0013360 | A1 | 1/2010 | Baborowski et al. |

FOREIGN PATENT DOCUMENTS

| JP | U-2-32229 | 2/1990 |
| JP | A-2002-261575 | 9/2002 |
| JP | A-2004-260718 | 9/2004 |
| WO | WO 2008/043727 A1 | 4/2008 |

OTHER PUBLICATIONS

Zener, "Elasticity and Anelasticity of Metals," University of Chicago Press, p. 1.
Zener et al., "Internal Friction in Solids III. Experimental Demonstration of Thermoelastic Internal Friction," Physical Review, vol. 53, Jan. 1, 1938, pp. 100-101.
Roszhart, "The Effect of Thermoelastic Internal Friction on the Q of Micromachined Silicon Resonators," IEEE, pp. 13-16 (1990).
Lifshitz et al., "Thermoelastic Damping in Micro- and Nanomechanical Systems," The American Physical Society, vol. 61, No. 8, pp. 5600-5609 (2000).
Vigevani et al., "Piezo Thermoelastic Model for Design Optimization of Resonant Beams," IEEE, pp. 1536-1539 (2008).
Hwang et al., "Fabrication of Electrostatically-Actuated, In-Plane Fused Quartz Resonators Using Silicon-on-Quartz (SOQ) Bonding and Quartz Drie,"IEEE, pp. 729-732 (2009).
Itoh et al., "Analysis of Q-Value of Quartz Crystal Tuning Fork Using Thermoelastic Coupling Equations," Japanese Journal of Applied Physics, vol. 48, (Jul. 21, 2009).
Muller et al. "Experimental Evidence of Thermoelastic Damping in Silicon Tuning Fork," Procedia Chemistry, pp. 1395-1398 (2009).

*Primary Examiner* — Derek Rosenau
(74) *Attorney, Agent, or Firm* — Oliff & Berridge, PLC

(57) ABSTRACT

A flexural vibration piece includes a flexural vibrator that has a first region on which a compressive stress or a tensile stress acts due to vibration and a second region having a relationship in which a tensile stress acts thereon when a compressive stress acts on the first region and a compressive stress acts thereon when a tensile stress acts on the first region, and performs flexural vibration in a first plane. The flexural vibration piece also includes a heat conduction path, in the vicinity of the first region and the second region, that is formed of a material having a thermal conductivity higher than that of the flexural vibrator and thermally connects between the first region and the second region.

9 Claims, 10 Drawing Sheets

| MATERIAL NAME | THERMAL CONDUCTIVITY (Wm$^{-1}$K$^{-1}$) |
|---|---|
| GOLD (Au) | 315 |
| SILVER (Ag) | 427 |
| ALUMINUM (Al) | 237 |
| COPPER (Cu) | 398 |
| ALUMINUM NITRIDE (AlN) | 285 |
| DIAMOND (C) | 1350 |

FIG. 4

FLEXURAL VIBRATION PIECE AND OSCILLATOR USING THE SAME

BACKGROUND

1. Technical Field

The present invention relates to a flexural vibration piece that vibrates in a flexural mode and an oscillator using the same.

2. Related Art

As a flexural vibration piece that vibrates in a flexural mode in the related art, a tuning fork-type flexural vibration piece has been widely used in which a pair of vibration arms are extended in parallel to each other from a base formed of a base material such as a piezoelectric material and are caused to horizontally vibrate toward each other and away from each other. When the vibration arms of the tuning fork-type flexural vibration piece are excited, the occurrence of the vibration energy loss causes a reduction in performance of the vibration piece, such as an increase in CI (Crystal Impedance) value or a reduction in Q value. For preventing or decreasing such a vibration energy loss, various measures have been taken in the related art.

For example, a tuning fork-type quartz vibration piece has been known in which a notch or a notch groove having a predetermined depth is formed on both side portions of a base from which vibration arms extend (for example, refer to JP-A-2002-261575 and JP-A-2004-260718). In the tuning fork-type quartz vibration piece, when the vibration of the vibration arms includes also a vertical component, the notch or the notch groove reduces the leakage of vibration from the base. Therefore, the confinement effect of vibration energy is enhanced to control the CI value and prevent irregularities in CI values between vibration pieces.

In addition to the mechanical vibration energy loss, vibration energy loss is also caused by heat conduction due to the temperature difference caused between a compression portion on which a compressive stress of the vibration arms that perform flexural vibration acts and an extension portion on which a tensile stress acts. A reduction in Q value caused by the heat conduction is called a thermoelastic loss effect.

For preventing or suppressing the reduction in Q value due to the thermoelastic loss effect, a tuning fork-type vibration piece in which a groove or a hole is formed on the center line of vibration arms (vibration beams) having a rectangular cross section is disclosed in, for example, JP-UM-A-2-32229.

JP-UM-A-2-32229 describes, based on a well-known relational formula between strain and stress in the case of internal friction in solids generally caused by temperature difference, that in the thermoelastic loss in a vibration piece in a flexural vibration mode, the Q value becomes minimum in the case where the number of relaxation oscillations $fm=1/(2\pi\tau)$ (where $\tau$ is a relaxation time) when the number of vibrations changes. The relationship between the Q value and frequency generally expressed as the curve F in FIG. 11 (for example, refer to C. Zener and other two persons, "Internal Friction in Solids III. Experimental Demonstration of Thermoelastic Internal Friction", PHYSICAL REVIEW, Jan. 1, 1938, Volume 53, p. 100-101). In the drawing, the frequency at which the Q value takes a minimum value $Q_0$ is a thermal relaxation frequency $f_0$ $(=1/(2\pi\tau))$, that is, the thermal relaxation frequency $f_0$ is the same as the number of relaxation oscillations fm.

Description will be made specifically with reference to the drawing. In FIG. 10, a tuning fork-type quartz vibration piece 1 of JP-UM-A-2-32229 includes two vibration arms 3 and 4 extending from a base 2 in parallel to each other. The vibration arms 3 and 4 are provided with linear grooves or holes 6 and 7 on the respective center lines. When a predetermined drive voltage is applied to a not-shown excitation electrode of the tuning fork-type quartz vibration piece 1, the vibration arms 3 and 4 perform flexural vibration toward each other and away from each other as indicated by imaginary lines (two-dot chain lines) and arrows in the drawing.

Due to the flexural vibration, a mechanical strain occurs in regions of root portions of the respective vibration arms 3 and 4 at the base 2. That is, in the root portion of the vibration arm 3 at the base 2, a first region 10 on which a compressive stress or a tensile stress acts due to the flexural vibration and a second region 11 having a relationship in which a tensile stress acts thereon when a compressive stress acts on the first region 10 and a compressive stress acts thereon when a tensile stress acts on the first region 10 are present. In the first region 10 and the second region 11, temperature increases when a compressive stress acts, while temperature decreases when a tensile stress acts.

Similarly, in the root portion of the vibration arm 4 at the base 2, a first region 12 on which a compressive stress or a tensile stress acts due to the flexural vibration and a second region 13 having a relationship in which a tensile stress acts thereon when a compressive stress acts on the first region 12 and a compressive stress acts thereon when a tensile stress acts on the first region 12 are present. In the first region 12 and the second region 13, temperature increases when a compressive stress acts, while temperature decreases when a tensile stress acts.

Due to the thus generated temperature gradient, inside the root portions of the respective vibration arms 3 and 4 at the base 2, heat conduction occurs between the first region 10 and the second region 11 and between the first region 12 and the second region and 13. The temperature gradient is generated in opposite directions corresponding to the flexural vibration of the vibration arms 3 and 4, and also the heat conduction changes in direction corresponding thereto. Due to the heat conduction, part of the vibration energy of the vibration arms 3 and 4 is constantly lost during vibration as thermoelastic loss. As a result, the Q value of the tuning fork-type quartz vibration piece 1 decreases, which makes it difficult to realize a desired, high performance. In the tuning fork-type quartz vibration piece 1 disclosed in JP-UM-A-2-32229, heat transfer from a compression side to a tensile side is blocked by the grooves or holes 6 and 7 disposed on the respective center lines of the vibration arms 3 and 4, so that the decrease in Q value due to the thermoelastic loss can be prevented or diminished.

However, in the tuning fork-type quartz vibration piece 1 disclosed in JP-UM-A-2-32229, it becomes difficult along with miniaturization to form the grooves or holes having a shape by which a reduction in Q value due to the thermoelastic loss can be prevented or reduced. In addition, there might be a problem that an effect of suppressing the reduction in Q value cannot be sufficiently provided.

SUMMARY

An advantage of some aspects of the invention is to solve at least a part of the problem and can be realized as the following aspects or applications.

First Application

A first application of the invention is directed to a flexural vibration piece including: a flexural vibrator that has a first region on which a compressive stress or a tensile stress acts due to vibration and a second region having a relationship in which a tensile stress acts thereon when a compressive stress acts on the first region and a compressive stress acts thereon when a tensile stress acts on the first region; and a heat conduction path, in the vicinity of the first region and the second region, that is formed of a material having a thermal conductivity higher than that of the flexural vibrator and thermally connects between the first region and the second region, wherein when m is the number of heat conduction paths, $\alpha_{th}$ is the thermal conductivity of the heat conduction path, $\alpha_v$ is the thermal conductivity of the flexural vibrator, $t_v$ is the thickness of the flexural vibrator in a direction orthogonal to a vibration direction of the flexural vibrator, and $t_{th}$ is the thickness of the heat conduction path in the direction orthogonal to a vibration direction of the flexural vibrator, a relationship of $t_{th} \geq (t_v/m) \times (\alpha_v/\alpha_{th})$ is satisfied.

The present inventor has found that according to the configuration, a thermal relaxation time required for the temperature difference caused between the first region and the second region reaching a state of equilibrium is shortened due to the heat conduction path having a thermal conductivity higher than that of the flexural vibrator, and therefore a reduction in Q value is suppressed.

Since the heat conduction path can be disposed without forming the hole or groove in the flexural vibrator unlike the related-art measures described above, the configuration is advantageous for responding to the miniaturization of the flexural vibration piece.

Accordingly, it is possible to provide a small flexural vibration piece in which a reduction in Q value is suppressed and vibration characteristics are stabilized.

Second Application

A second application of the invention is directed to a flexural vibration piece including: a flexural vibrator that has a first region on which a compressive stress or a tensile stress acts due to vibration and a second region having a relationship in which a tensile stress acts thereon when a compressive stress acts on the first region and a compressive stress acts thereon when a tensile stress acts on the first region, and performs flexural vibration in a first plane; and a heat conduction path, in the vicinity of the first region and the second region, that is formed of a material having a thermal conductivity higher than that of the flexural vibrator and thermally connects between the first region and the second region, wherein when m is the number of heat conduction paths, $\alpha_{th}$ is the thermal conductivity of the heat conduction path, $\alpha_v$ is the thermal conductivity of the flexural vibrator, $t_v$ is the thickness of the flexural vibrator in a direction orthogonal to the first plane, and $t_{th}$ is the thickness of the heat conduction path, a relationship of $t_{th} \geq (t_v/m) \times (\alpha_v/\alpha_{th})$ is satisfied.

The present inventor has found that according to the configuration, a thermal relaxation time required for the temperature difference caused between the first region and the second region reaching a state of equilibrium is shortened due to the heat conduction path having a thermal conductivity higher than that of the flexural vibrator, and therefore a reduction in Q value is suppressed.

Third Application

A third application of the invention is directed to the flexural vibration piece according to the above-described application of the invention, wherein the flexural vibrator is formed so as to extend from one end of a base, and the heat conduction path is formed so as to pass over the base near the root of the flexural vibrator at the base. Moreover, in the flexural vibration piece according to the above-described application of the invention, a first electrode is formed in at least part of the first region, a second electrode is formed in at least part of the second region, and the heat conduction path is connected to the first electrode and the second electrode.

The present inventor has found that according to the configuration, the heat conduction path can be formed more easily compared to the case where the heat conduction path is disposed in the vibration arm.

Fourth Application

A fourth application of the invention is directed to the flexural vibration piece of the above-described application of the invention, wherein when $l_{th}$ is the length of the heat conduction path, and $l_v$ is the distance between the first region and the second region of the flexural vibrator, a relationship of $t_{th} \geq (t_v/m) \times (\alpha_v/\alpha_{th}) \times (l_{th}/l_v)$ is satisfied.

The present inventor has found that by defining the length or thickness of the heat conduction path so as to satisfy the relationship of the formula, an effect of suppressing the heat conduction loss can be provided more reliably.

Fifth Application

A fifth application of the invention is directed to the flexural vibration piece of the above-described application of the invention, wherein when $f_0$ is the thermal relaxation frequency of the flexural vibration piece in a state where the heat conduction path is not disposed, a relationship of $1 > fr/(f_0 + (f_{20} - f_0)/3)$ is satisfied. In the flexural vibration piece of the above-described application of the invention, wherein when fr is a mechanical oscillation frequency of the flexural vibrator, $f_{20}$ is a thermal relaxation frequency of the flexural vibration piece, $\pi$ is a ratio of the circumference of a circle to its diameter, k is a thermal conductivity of a material used for the flexural vibrator in a vibration direction, $\rho$ is a mass density of a material used for the flexural vibrator, $C_p$ is a heat capacity of the material used for the flexural vibrator, a is the width of the flexural vibrator in the vibration direction, and $f_0 = \pi k/(2\rho C_p a^2)$, a relationship of $1 > fr/(f_0 + (f_{20} - f_0)/3)$ is satisfied.

The present inventor has found that according to the configuration, it is possible to provide a flexural vibration piece assuring a Q value higher than that of a flexural vibration piece of the related-art structure and having stable vibration characteristics.

Sixth Application

A sixth application of the invention is directed to the flexural vibration piece of the above-described application of the invention, wherein when fr is a mechanical oscillation frequency of the flexural vibrator, $\pi$ is a ratio of the circumference of a circle to its diameter, k is a thermal conductivity of a material used for the flexural vibrator in a vibration direction, $\rho$ is a mass density of a material used for the flexural vibrator, $C_p$ is a heat capacity of the material used for the flexural vibrator, a is a width of the flexural vibrator in the vibration direction, and $f_0 = \pi k/(2\rho C_p a^2)$, a relationship of $1 \geq fr/f_0$ is satisfied.

According to the configuration, it is possible to provide a flexural vibration piece assuring a high Q value and having stable vibration characteristics.

Seventh Application

A seventh application of the invention is directed to the flexural vibration piece of the above-described application of the invention, wherein when $\tau_0$ is a thermal relaxation time required for a temperature between the first region and the second region reaching a state of equilibrium in the case where the heat conduction path is not disposed, and $\tau_1$ is the thermal relaxation time in the case where the heat conduction path is disposed, a relationship of $\tau_1 < \tau_0$ is satisfied; and when $f_0$ is the thermal relaxation frequency of the flexural vibrator determined by $1/(2\pi\tau_0)$, and fr is the mechanical resonant frequency of the flexural vibrator, a relationship of $1 \geq fr/f_0$ is satisfied.

According to the configuration, since the thermal relaxation frequency $f_{20}$ is higher than the mechanical resonant frequency fr, a relationship of $1=fr/f_0$ in which the Q value becomes minimum can be avoided. Therefore, it is possible to provide a flexural vibration piece in which the Q value is improved.

Eighth Application

An eighth application of the invention is directed to the flexural vibration piece of the above-described application of the invention, wherein all or a part of the heat conduction path is formed by burying a material having a thermal conductivity higher than that of the flexural vibrator into a through hole that penetrates from the first region to the second region of the flexural vibrator or a through hole that penetrates in the vicinity of the first region and the second region.

According to the configuration, since it is possible to further shorten the heat conduction path that thermally connects between the first region and the second region, the Q value can be further stabilized.

Ninth Application

A ninth application of the invention is directed to the flexural vibration piece of the above-described application of the invention, wherein the flexural vibrator is formed of a base and vibration arms extending from one end portion of the base, and the heat conduction path is disposed so as to go through the base.

According to the configuration, the heat conduction path can be formed more easily compared to the case where the heat conduction path is disposed in the vibration arm. For example, in the case of the heat conduction path according to the above-described application, which is formed of the through hole and the material having a high thermal conductivity buried in the through hole, the base having a large area facilitates a hole making process.

Tenth Application

A tenth application of the invention is directed to an oscillator at least including: the flexural vibration piece according to the above-described application of the invention; and an oscillator circuit that drives the flexural vibration piece.

According to the configuration, it is possible to provide a small oscillator having stable oscillation characteristics because the oscillator includes the flexural vibration piece in which a reduction in Q value is suppressed as shown in the above-described application of the invention.

BRIEF DESCRIPTION OF THE DRAWINGS

The invention will be described with reference to the accompanying drawings, wherein like numbers reference like elements.

FIG. 4 is a table showing materials applicable to a heat conduction path of the tuning fork-type quartz vibration piece and the thermal conductivities of the materials.

DESCRIPTION OF EXEMPLARY EMBODIMENTS

Hereinafter, an embodiment in which a flexural vibration piece of the invention is embodied in a tuning fork-type quartz vibration piece will be described with reference to the drawings.

Figure 1:
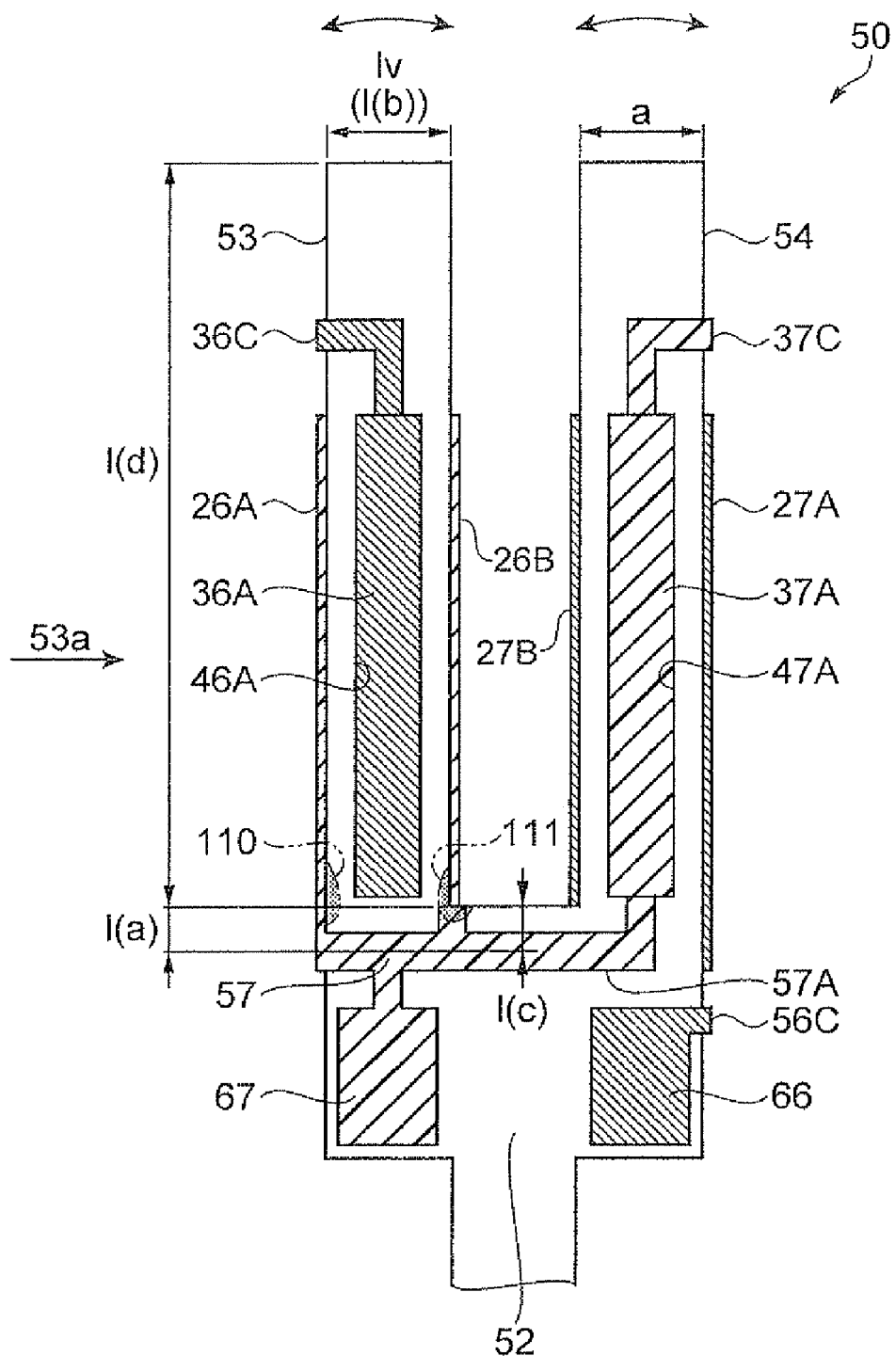
FIG. 1 is a plan view of one main surface side for schematically explaining an embodiment of a tuning fork-type quartz vibration piece as a flexural vibration piece.
Figure 2:
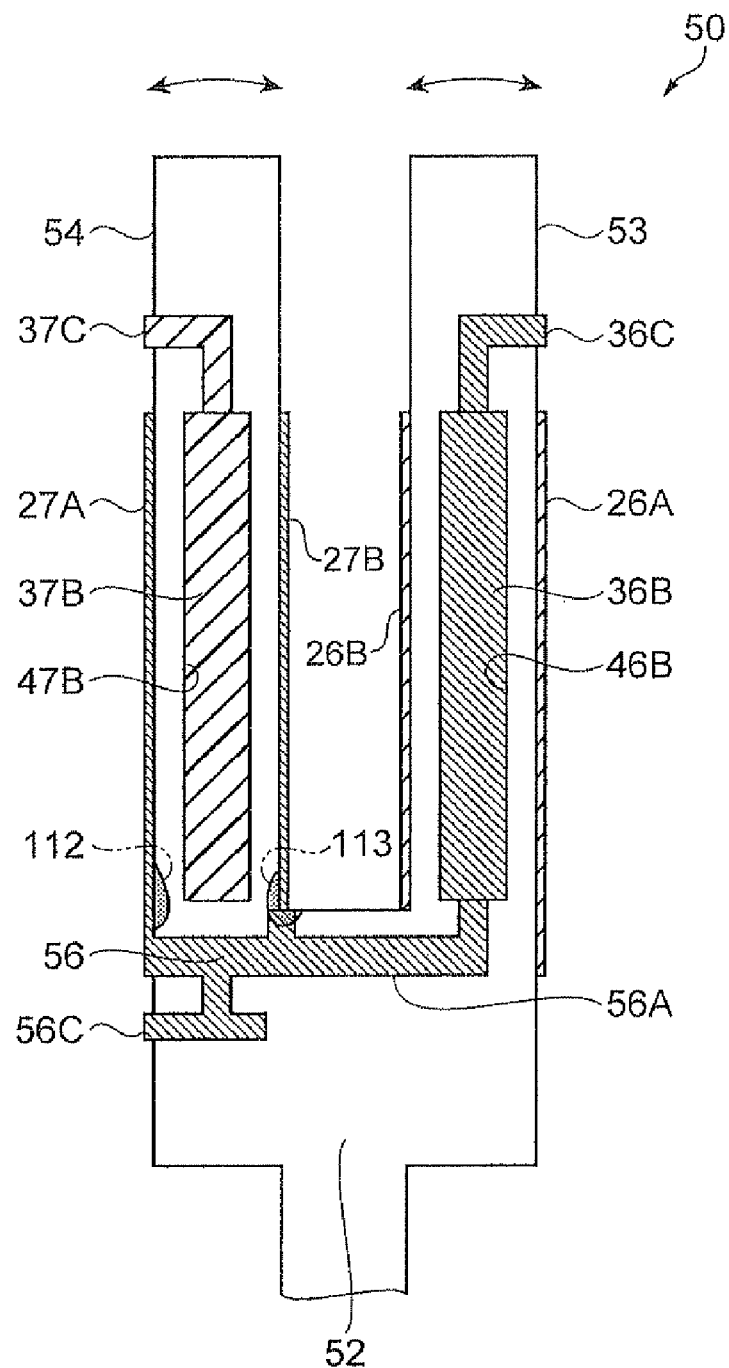
FIG. 2 is a plan view of the other main surface side for schematically explaining the embodiment of the tuning fork-type quartz vibration piece.
Figure 3:
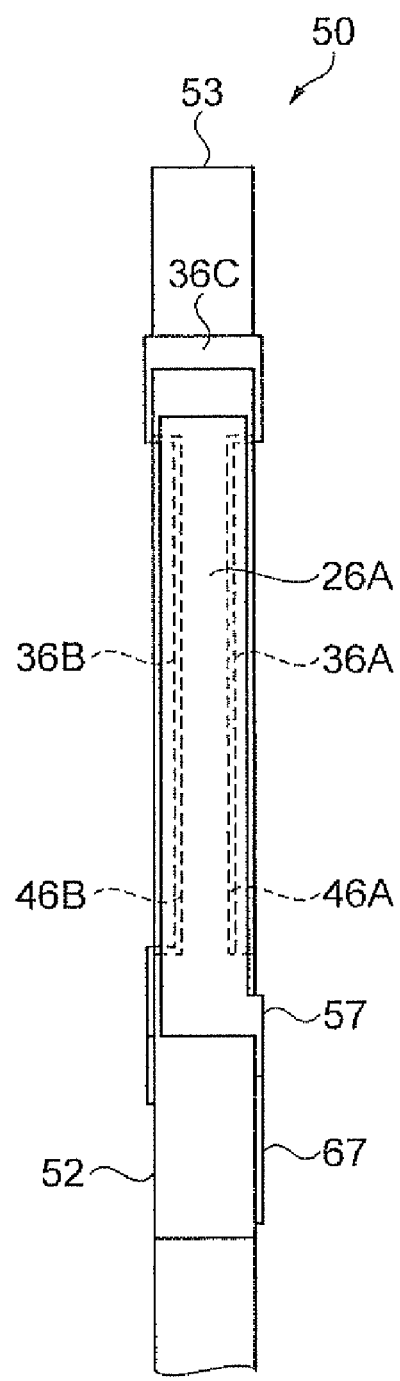
FIG. 3 is a side view of the tuning fork-type quartz vibration piece viewed from an arrow in FIG. 1.

FIGS. 1 to 3 schematically explain a tuning fork-type quartz vibration piece of the embodiment. FIG. 1 is a plan view of one main surface side. FIG. 2 is a plan view of the other main surface side. FIG. 3 is a side view viewed from the direction of an arrow 53a in FIG. 1. In FIGS. 1 and 2, electrode portions such as excitation electrodes are hatched for the convenience of clearly showing the configuration of each part, and the hatching does not show metal cross sections.

In FIG. 1, a tuning fork-type quartz vibration piece 50 of the embodiment is formed to have a so-called tuning fork-type external shape with a base 52 that is formed by processing a flexural vibrator material and a pair of vibration arms 53 and 54 bifurcated from one end side (an upper end side in the drawing) of the base 52 and extending in parallel to each other. As the flexural vibrator material, a material cut out from a single crystal of quartz is used in the same manner as in a related-art tuning fork-type quartz vibration piece. For example, the material is formed from a so-called Z-cut quartz thin plate with the Y-axis of crystal axis of quartz being directed to a longitudinal direction of the vibration arms 53 and 54, the X-axis being directed to a width direction of the vibration arms, and the Z-axis being directed to a vertical direction of the front and rear main surfaces of the vibration piece. The tuning fork-type external shape of the tuning fork-type quartz vibration piece 50 can be precisely formed by wet etching with hydrofluoric acid solution or dry etching a quartz substrate material such as a quartz wafer, for example.

For suppressing the CI value, linear grooves 46A and 47A each having a bottom are respectively formed on one main surfaces of the vibration arms 53 and 54 along a longitudinal direction. Excitation electrodes 36A and 37A are formed on the respective surfaces, including the bottom surfaces, of the grooves 46A and 47A. In the vicinity of the other end side of the base 52 different from the one end side from which the vibration arms 53 and 54 are extended, external connection electrodes 66 and 67 serving for external connection are disposed. The external connection electrodes 66 and 67 respectively correspond to the excitation electrodes 36A and 37A. In the embodiment, the excitation electrode 37A is connected to the external connection electrode 67 with a routing wire 57A including a heat conduction path 57 (described in detail later). The excitation electrode 36A is led through a connection electrode 36C and then connected to the other external connection electrode 66 via a routing wire 56C that is connected to a later-described connection electrode 56A formed on the other main surface.

The routing wire 36C is led from one end portion of the excitation electrode 36A of the vibration arm 53 on the opposite side from the base 52. The routing wire 36C connects between the excitation electrode 36A and a later-described excitation electrode 36B (refer to FIGS. 2 and 3) disposed on the main surface (the other main surface) on the opposite side from the surface on which the excitation electrode 36A is formed.

A routing wire 37C is led from one end portion of the excitation electrode 37A of the vibration arm 54 on the opposite side from the base 52. The connection electrode 37C connects between the excitation electrode 37A and a later-described excitation electrode 37B (refer to FIG. 2) disposed on the main surface (the other main surface) on the opposite side from the surface on which the excitation electrode 37A is formed.

Similarly, as shown in FIG. 2, linear grooves 46B and 47B each having a bottom are respectively formed on the other main surfaces of the vibration arms 53 and along a longitudinal direction. The excitation electrodes 36B and 37B are disposed on the respective surfaces, including the bottom surfaces, of the grooves 46B and 47B.

The excitation electrode 368 of the vibration arm 53 is connected to the excitation electrode 36A (refer to FIGS. 1 and 3) with the routing wire 36C led from one end portion of the vibration arm 53 on the opposite side from the base 52 by way of the side surface side of the vibration arm 53. The excitation electrode 36A is disposed on the main surface (the one main surface) on the opposite side from the surface on which the excitation electrode 36B is formed. The excitation electrode 36B is also connected to the external connection electrode 66 (refer to FIG. 1) by way of the routing wire 56A and the routing wire 56C disposed on the side surface of the base 52. The connection electrode 56A is led from one end portion of the excitation electrode 36B on the base 52 side and includes a later-described heat conduction path 56. The external connection electrode 66 is formed on the base 52 on the main surface (the one main surface) side on the opposite side from the surface on which the excitation electrode 36B of the tuning fork-type quartz vibration piece 50 is formed.

The excitation electrode 37B of the vibration arm 54 is connected to the excitation electrode 37A (refer to FIG. 1) with the routing wire 37C that is led from one end portion of the excitation electrode 37B of the vibration arm 54 on the opposite side from the base 52 by way of the side surface side of the vibration arm 54. The excitation electrode 37A is disposed on the main surface on the opposite side from the surface on which the excitation electrode 37B is formed.

The above-described electrodes and wires can be formed as follows. After etching quartz to form the external shape of the tuning fork-type quartz vibration piece 50, an electrode layer of gold (Au), for example, is deposited by deposition or sputtering on an under layer of nickel (Ni) or chromium (Cr), for example. Thereafter, the electrode layer is patterned by photolithography. However, the metal material for other electrodes and wires is sometimes selected for their formation in accordance with the metal material for forming the heat conduction paths 56 and 57 as will be described in detail later.

Here, the heat conduction paths 56 and 57 that serve particularly as an essential part in the configuration of the invention in the tuning fork-type quartz vibration piece 50 of the embodiment will be described in detail.

In FIGS. 1 and 3, the heat conduction path 57 is formed on the base 52 in the vicinity of the root of the vibration arm 53 at the base 52. The heat conduction path 57 is connected to side surface electrodes 26A and 26B respectively disposed on both side surfaces of the vibration arm 53 orthogonal to the main surface thereof on which the excitation electrode 36A is formed. The side surface electrodes 26A and 26B are formed in regions respectively including a first region 110 and a second region 111 as the roots of the vibration arm 53 at the base 52 in a flexural vibration direction indicated by the arrow in the drawing. With this configuration, the heat conduction path 57 thermally connects between the first region 110 and the second region 111. In addition in the embodiment, the heat conduction path 57 serves as a relay connecting portion of an inter-terminal (inter-electrode) metal that connects between the excitation electrode 37A of the vibration arm 54 and the external connection electrode 67 together with the routing wire 57A.

Similarly, as shown in FIG. 2, in the tuning fork-type quartz vibration piece 50 of the embodiment, the heat conduction path 56 is formed on the base 52 in the vicinity of the root of the vibration arm 54 at the base 52. The heat conduction path 56 is connected to side surface electrodes 27A and 27B respectively disposed on both side surfaces of the vibration arm 54 orthogonal to the main surface thereof on which the excitation electrode 37B is formed. The side surface electrodes 27A and 27B are formed in regions respectively including a first region 112 and a second region 113 as the root of the vibration arm 54 at the base 52 in the flexural vibration direction indicated by the arrow in the drawing. The heat conduction path 56 thermally connects between the first region 112 and the second region 113. In addition, the heat conduction path 56 serves as a relay metal portion that connects the connection electrode 56A led from the excitation electrode 36B of the vibration arm 53 with the external connection electrode 66 shown in FIG. 1 and the connection electrode 56C led from the external connection electrode 66.

In many cases, the side surface electrodes 26A, 26B, 27A, and 27B are usually used as parts of relay electrodes that connect various types of corresponding electrodes to each other on both the main surfaces of the tuning fork-type quartz vibration piece 50. In the embodiment, however, the illustration and description thereof is omitted.

A material having a high thermal conductivity is used for the heat conduction paths 56 and 57. The material is selected in view of relative easiness of availability, low cost, easiness of manufacturing when forming the heat conduction paths 56 and 57 on the flexural vibrator, and the like, in addition to the thermal conductivity. For example, the materials shown in FIG. 4 are preferably used. For enhancing the film adhesiveness of the heat conduction paths 56 and 57 with at least one of the base 52 and the vibration arms 53 and 54, an under film made of nickel (Ni), chromium (Cr), or the like may be disposed as an under layer of the heat conduction paths 56 and 57.

In the embodiment, the heat conduction paths 56 and 57 have to be a conductor because they serve also as the relay wiring portion of an inter-electrode wire. Therefore, diamond in the drawing is excluded. However, when the heat conduction path is formed separately from the routing wire, conductivity is not required for the material of the heat conduction path. Therefore, a non-conductive material having a high thermal conductivity, such as diamond in the drawing, can be properly used.

In FIG. 1, when a drive voltage is applied from an oscillator circuit (not shown) as exciting means connected to the outside to the excitation electrodes 36A and 36B and the excitation electrodes 37A and 37B in the tuning fork-type quartz vibration piece 50, the vibration arms 53 and 54 horizontally perform flexural vibration toward each other and away from each other as indicated by the arrows in the drawing. In the embodiment, it can be said that the base 52 and the vibration arms 53 and 54 are formed on a predetermined first plane, and that the vibration arms 53 and 54 perform flexural vibration in the first plane.

Due to the flexural vibration, in the connections between the base 52 and the respective vibration arms 53 and 54, a compressive stress and a tensile stress occur in the regions of the root portions of the respective vibration arms 53 and 54 in the vibration direction. That is, a compressive stress and a tensile stress occur in the first region 110 and the second region 111 of the vibration arm 53 in the drawing. Similarly to this, a compressive stress and a tensile stress occur also in the region of the connection of the vibration arm 54 with the base 52 (described in detail later). Description will be made in detail on the vibration arm 53 side in the drawing. When a free end side of the vibration arm 53 performs flexural vibration toward the vibration arm 54, a tensile stress acts on the first region 110 of the vibration arm 53 to decrease temperature, and a compressive stress acts on the second region 111 to increase temperature. Conversely, when the free end side of the vibration arm 53 bends away from the vibration arm 54, a compressive stress acts on the first region 110 to increase temperature, and a tensile stress acts on the second region 111 to decrease temperature.

Similarly, in FIG. 2, when a free end side of the vibration arm 54 performs flexural vibration toward the vibration arm 53, a tensile stress acts on the first region 112 of the vibration arm 54 to decrease temperature, and a compressive stress acts on the second region 113 to increase temperature. Conversely, when the free end side of the vibration arm 54 bends away from the vibration arm 53, a compressive stress acts on the first region 112 to increase temperature, and a tensile stress acts on the second region 113 to decrease temperature.

In this manner, inside the connections of the respective vibration arms 53 and 54 with the base 52, a temperature gradient is generated between the portion on which a compressive stress acts and the portion on which a tensile stress acts. The gradient changes in direction depending on the vibration direction of the vibration arms 53 and 54.

Due to the temperature gradient, heat conducts from the portion on the compression side to the portion on the tensile (extension) side, that is, from the portion on the high-temperature side to the portion on the low-temperature side.

In the tuning fork-type quartz vibration piece 50 of the embodiment, the heat conduction path from the portion on the compression side to the portion on the extension side is assured by the heat conduction path 57 (refer to FIGS. 1 and 3) in the vibration arm 53 and assured by the heat conduction path 56 (refer to FIG. 2) in the vibration arm 54. The heat conduction paths 56 and 57 are configured of a material having a thermal conductivity at least higher than that of quartz as the flexural vibrator. Therefore, the time for heat conduction from the compression side to the extension side is faster than in the case of a related-art structure in which the heat conduction paths 56 and 57 are not disposed. That is, a relaxation time $\tau_1$ required for the temperature reaching a state of equilibrium between the first regions 110 and 112 and the second regions 111 and 113 when the vibration arms 53 and 54 perform flexural vibration is shorter than a relaxation time $\tau_0$ of the related-art structure in which the heat conduction paths 56 and 57 are not disposed. That is, since $\tau_1 < \tau_0$ is established in a thermal relaxation frequency $f_{20} = 1/(2\pi\tau_1)$ of the tuning fork-type quartz vibration piece 50 of the embodiment, the thermal relaxation frequency $f_{20}$ in the embodiment is higher than a thermal relaxation frequency $f_0 = 1/(2\pi\tau_0)$ of the tuning fork-type quartz vibration piece having the related-art structure.

It is generally known that the thermal relaxation frequency $f_0$ is determined by the following equation (1):

$$f_0 = \pi k/(2\rho C_p a^2) \tag{1}$$

where $\pi$ is the ratio of the circumference of a circle to its diameter, k is the thermal conductivity of a vibration arm (flexural vibrator) in a flexural vibration direction, $\rho$ is the mass density of the vibration arm (flexural vibrator), $C_p$ is the heat capacity of the vibration arm (flexural vibrator), and a is the width of the vibration arm (flexural vibrator) in the flexural vibration direction. When constants of a material itself of the vibration arm are input to the thermal conductivity k, mass density $\rho$, and heat capacity $C_p$ of the equation (1), the thermal relaxation frequency $f_0$ to be determined is a relaxation oscillation frequency of a flexural vibrator in which the heat conduction paths that thermally connect between the first regions 110 and 112 and the second regions 111 and 113 are not disposed.

Figure 11:
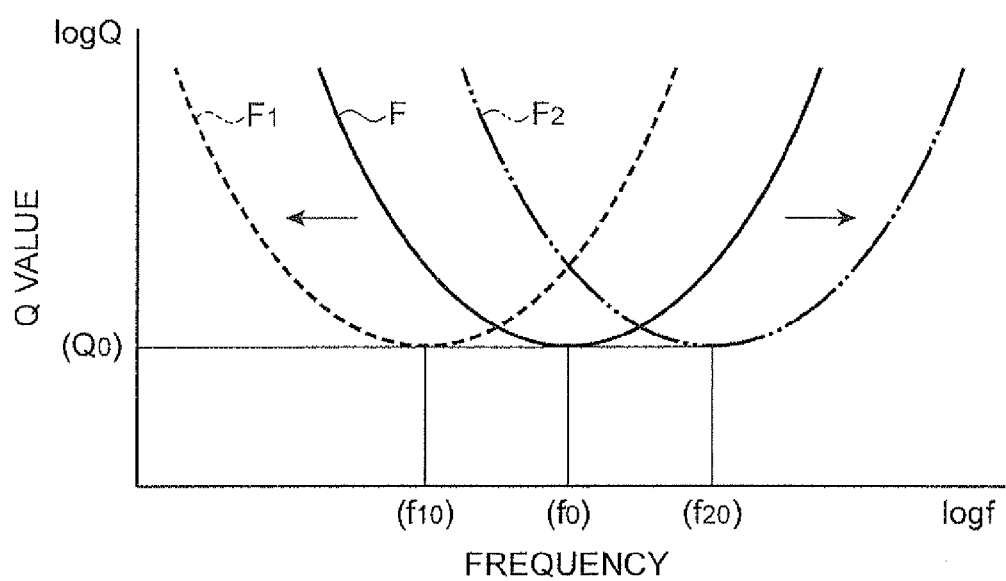
FIG. 11 is a graph showing the relationship between the relaxation frequency and minimum Q value in a flexural vibration piece in a flexural vibration mode.

In terms of the relationship between the mechanical oscillation frequency (resonant frequency) and Q value of the vibration arm in FIG. 11, since the shape of the curve F itself is not changed, the curve F is shifted to the position of the curve $F_2$ in a frequency increasing direction along with an increase in thermal relaxation frequency. Accordingly, in a range in which fr is equal to or less than the thermal relaxation frequency $f_0$, that is, in a range satisfying a relationship of $1 \geq fr/f_0$ where fr is the mechanical oscillation frequency (resonant frequency) of the vibration arm, the Q value on the curve $F_2$ is always higher than that on the curve F of the tuning fork-type quartz vibration piece of the related-art structure. In addition, also in a frequency band at a frequency lower than that at an intersection of the curve F and the curve $F_2$, that is, in a range satisfying a relationship of $1 > fr/(f_0 + (f_{20} - f_0)/3)$ on the curve $F_2$, the Q value is higher than that on the curve F of the tuning fork-type quartz vibration piece having the related-art structure. In this manner, in the tuning fork-type quartz vibration piece 50 of the embodiment, the heat conduction paths 56 and 57 that thermally connect between the first regions 110 and 112 and the second regions 111 and 113 of the vibration arms 53 and 54 are disposed, so that it is possible to improve the Q value and realize high performance.

In this case, the heat conduction paths 56 and are formed in the vicinity of the first regions 110 and 112 and the second regions 111 and 113 of the base 52 so that the thermal relaxation between the first regions 110 and 112 and the second regions 111 and 113 where the increase or decrease in temperature along with the flexural vibration of the vibration arms 53 and 54 is caused is performed in a short time.

The present inventor has found in the configuration of the tuning fork-type quartz vibration piece 50 of the embodiment that an effect of suppressing a reduction in Q value due to the heat conduction path is provided by satisfying a relationship of $t_{th} \geq (t_v/m) \times (\alpha_v/\alpha_{th})$ when m is the number of heat conduction paths in each of the vibration arms 53 and 54 having the first region and the second region, $\alpha_{th}$ is the thermal conductivity of a material used for the heat conduction paths 56 and 57, $\alpha_v$ is the thermal conductivity of the flexural vibrator (quartz in the embodiment), $t_v$ is the thickness of the vibration arms 53 and 54 in a direction orthogonal to a flexural vibration direction, and $t_{th}$ is the thickness of the heat conduction paths 56 and 57 in the direction orthogonal to the flexural vibration direction of the vibration arms 53 and 54. That is, by satisfying the condition, it is possible to avoid an unfavorable state in which heat conducts more easily in the flexural vibrator (quartz in the embodiment) than in the heat conduction paths 56 and 57. It is preferable to satisfy a relationship of $t_{th} > (t_v/m) \times (\alpha_v/\alpha_{th})$. With this condition, it is possible to reliably realize a state in which heat conducts more easily in the heat conduction paths 56 and 57 than in the flexural vibrator (quartz in the embodiment), so that the improvement of the Q value caused by shortening the thermal relaxation time is reliably achieved.

For example, in the tuning fork-type quartz vibration piece 50 of the embodiment, in the case where the thermal conductivity $\alpha_v$ of the flexural vibrator when using a so-called Z-cut quartz is 6.2 $Wm^{-1}K^{-1}$, the thermal conductivity $\alpha_{th}$ when using gold for the heat conduction paths 56 and 57 is 315 $Wm^{-1}K^{-1}$, the number m of heat conduction paths in each of the vibration arms 53 and 54 when disposing only on one main surface side is one, and the thickness $t_v$ of the vibration arms 53 and 54 in the direction orthogonal to the flexural vibration direction is 100 μm, if the thickness of the heat conduction paths 56 and 57 is ensured to be 2 μm or more, a reduction in Q value can be suppressed compared to the case where the heat conduction paths 56 and 57 are not disposed.

In the embodiment, the heat conduction path 56 or 57 by the number m=1 is disposed on one of main surface sides of each of the vibration arms 53 and 54. This is not restrictive. It is possible to dispose the heat conduction path on both main surfaces of each of the vibration arms so that m=2. Moreover, it is also possible to dispose the heat conduction path on both main surfaces of each of the vibration arms and also dispose the heat conduction path by using a later-described through hole so that m=3. As the number m of the heat conduction paths is larger, the more heat conducts easily through the heat conduction path while decreasing the rate of going through the flexural vibrator. Therefore, it is apparent that a thermal relaxation time τ can be efficiently shortened. For example, in the case where the thermal conductivity $\alpha_v$ of the flexural vibrator is 6.2 $Wm^{-1}K^{-1}$, the thermal conductivity $\alpha_{th}$ of the heat conduction path is 315 $Wm^{-1}K^{-1}$, the thickness $t_v$ of the vibration arms in the direction orthogonal to the vibration direction is 100 μm, and the number m of the heat conduction paths when disposing one heat conduction path on both main surfaces of each of the vibration arms is two, it is sufficient to ensure the thickness of the heat conduction path to be 1 μm or more.

The present inventor also has found that by satisfying a relationship of $t_{th} \geq (t_v/m) \times (\alpha_v/\alpha_{th}) \times (l_{th}/l_v)$ when $l_{th}$ is the length of the heat conduction path, and $l_v$ is the heat conduction path length between the first region and the second region, an effect of suppressing a reduction in Q value due to the heat conduction path is more reliably provided. That is, the present inventor has found that when the length $l_{th}$ of the heat conduction path is large, it is necessary to shorten the thermal relaxation time by increasing the thickness $t_{th}$ of the heat conduction paths 56 and 57 corresponding to the length.

In FIG. 1 for example, the path length $l_{th}$ of the heat conduction path 57 from the first region 110 to the second region 111 in the vibration arm 53 of the embodiment is expressed as $l_{th}=l(a)+l(b)+l(c)$ as indicated by the dimension lines and reference signs in the drawing. On the other hand, in the case where the heat conduction path is formed on the side surface portion of the vibration arm, which is used as the forming region of the wiring path in the related art, when the path length $l_{th0}$ of the heat conduction path is indicated by the dimension lines and reference signs in the drawing, $l_{th0}=l_v+2\times l(d)$ (where $l_v$ is the width of the vibration arm 53 in a direction parallel to the vibration direction, and l(d) is the length from the root of the vibration arm 53 at the base 52 to the tip end on the free end side).

Specifically, in the case where l(a)=50 μm, l(b)=50 μm, and l(c)=50 μm with the dimensions of the vibration arm 53 as $l_v$=50 μm (=l(b)) and l(d)=1500 μm, the path length is 3050 μm when the heat conduction path is disposed by utilizing the side surface of the vibration arm 53, whereas the path length of the heat conduction path 57 of the embodiment is 150 μm. Compared to the related-art heat conduction path length, it is understood that the heat conduction paths 56 and 57 of the embodiment can be considerably shortened.

In the embodiment, parts of the routing wires connecting between the excitation electrodes 36A, 36B, 37A, and 37B and the external connection electrodes 66 and 67 corresponding thereto are used as the heat conduction paths 56 and 57. With this configuration, measures for stabilizing the Q value can be taken with high space efficiency. Therefore, the configuration is advantageous for the miniaturization of the tuning fork-type quartz vibration piece 50.

The tuning fork-type quartz vibration piece as the flexural vibration piece described in the embodiment can be implemented as the following modifications.

First Modification

In the embodiment, the heat conduction paths 56 and 57 are disposed on the main surface of the base 52 of the flexural vibrator. This is not restrictive, and the heat conduction path may be buried in a through hole disposed inside the flexural vibrator.

Figure 5:
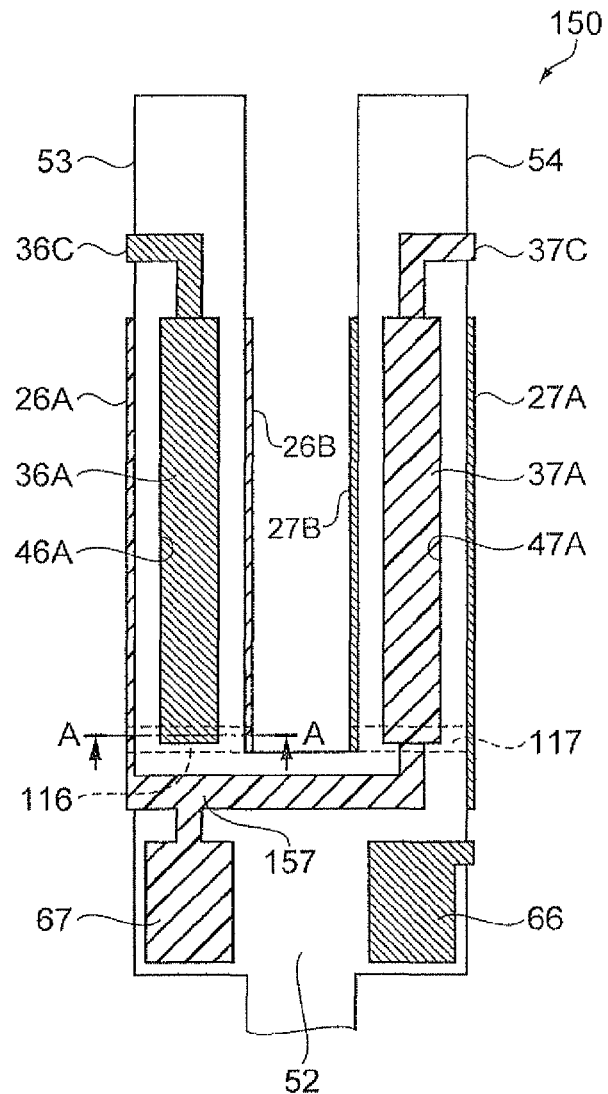
FIG. 5 is a plan view for schematically explaining a tuning fork-type quartz vibration piece of a first modification.
Figure 6:
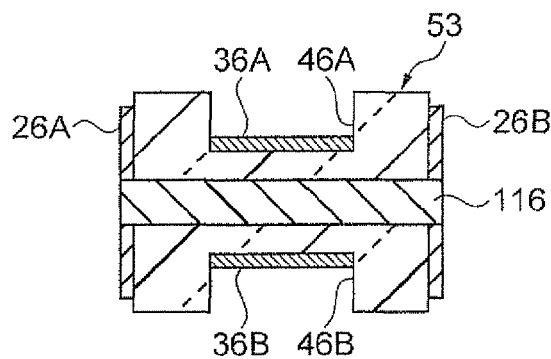
FIG. 6 is a cross-sectional view taken along line A-A in FIG. 5 for schematically explaining the tuning fork-type quartz vibration piece of the first modification.

FIGS. 5 and 6 schematically explain a modification of a tuning fork-type quartz vibration piece in which heat conduction paths are disposed inside a flexural vibrator. FIG. 5 is a plan view of one main surface side. FIG. 6 is a cross-sectional view taken along line A-A in FIG. 5. FIG. 5 is the plan view of the same main surface side as that of FIG. 1. In FIGS. 5 and 6 of the modification, the same constituent as in the embodiment is denoted by the same reference numeral and sign, and the description thereof is omitted.

In FIG. 5, a tuning fork-type quartz vibration piece 150 of the modification is formed of the base 52 formed of a flexural vibrator material and the pair of vibration arms 53 and 54 bifurcated from one end side of the base 52 and extending in parallel to each other. The grooves 46A and 47A each having a bottom are formed on the respective main surfaces of the vibration arms 53 and 54. The excitation electrodes 36A and 37A are formed on the respective surfaces, including the bottom surfaces, of the grooves 46A and 47A. In the vicinity of the other end side of the base 52 different from the one end side from which the vibration arms 53 and 54 are extended, the external connection electrodes 66 and 67 are disposed. The external connection electrodes 66 and 67 respectively correspond to the excitation electrodes 36A and 37A. The excitation electrode 37A is connected to the external connection electrode 67 with a routing wire 157. The excitation electrode 36A is led through the connection electrode 36C and then connected to the external connection electrode 66 via the routing wire formed on the other main surface in the same manner as the embodiment.

Excitation electrodes as counter electrodes of the excitation electrodes 36A and 37A are respectively disposed on the main surfaces (the other main surfaces) of the vibration arms 53 and 54 on the opposite side in the same manner as the embodiment. The excitation electrodes formed on both the main surfaces of the respective vibration arms 53 and 54 are connected to each other with the connection electrodes 36C and 37C.

The side surface electrodes 26A and 26B are respectively disposed on both side surfaces of the vibration arm 53 orthogonal to the main surface thereof on which the excitation electrode 36A is formed. In the vicinity of the root portion of the vibration arm 53 at the base 52, a heat conduction path 116 is disposed. The heat conduction path 116 is formed by burying a material having a high thermal conductivity shown in FIG. 4, for example, into a through hole that penetrates in the same direction as the flexural vibration direction of the vibration arm 53. As shown in FIG. 6, the side surface electrodes 26A and 26B of the vibration arm 53 are thermally connected to each other with the heat conduction path 116.

Similarly, the side surface electrodes 27A and 27B are respectively disposed on both side surfaces of the other vibration arm 54 orthogonal to the main surface thereof on which the excitation electrode 37A is formed. In the vicinity of the root portion of the vibration arm at the base 52, a heat conduction path 117 is disposed. The heat conduction path 117 is formed by burying a material having a high thermal conductivity into a through hole that penetrates in the same direction as the flexural vibration direction of the vibration arm 54. Therefore, the side surface electrodes 27A and 27B are thermally connected to each other.

According to the configuration, since a thermal relaxation time $\tau 1$ between the regions (the first region and the second region) where the increase or decrease in temperature is caused along with the flexural vibration of the vibration arms 53 and 54 is shortened, an effect of stabilizing the Q value of the tuning fork-type quartz vibration piece 150 is provided.

In the tuning fork-type quartz vibration piece 150 of the first modification, when there is a need to electrically connect between the side surface electrodes 26A and 26B of the vibration arm 53 and between the side surface electrodes 27A and 27B of the vibration arm 54, a metal material having conductivity among the materials having a high thermal conductivity shown in FIG. 4, for example, may be used as the material to be buried into the through hole of the heat conduction paths 116 and 117.

When there is no need to electrically connect between the side surface electrodes 26A and 26B of the vibration arm 53 and between the side surface electrodes 27A and 27B of the vibration arm 54, the material to be buried into the through hole of the heat conduction paths 116 and 117 may not have conductivity. Moreover, the side surface electrodes 26A, 26B, 27A, and 27B may not be disposed.

Second Modification

Figure 7:
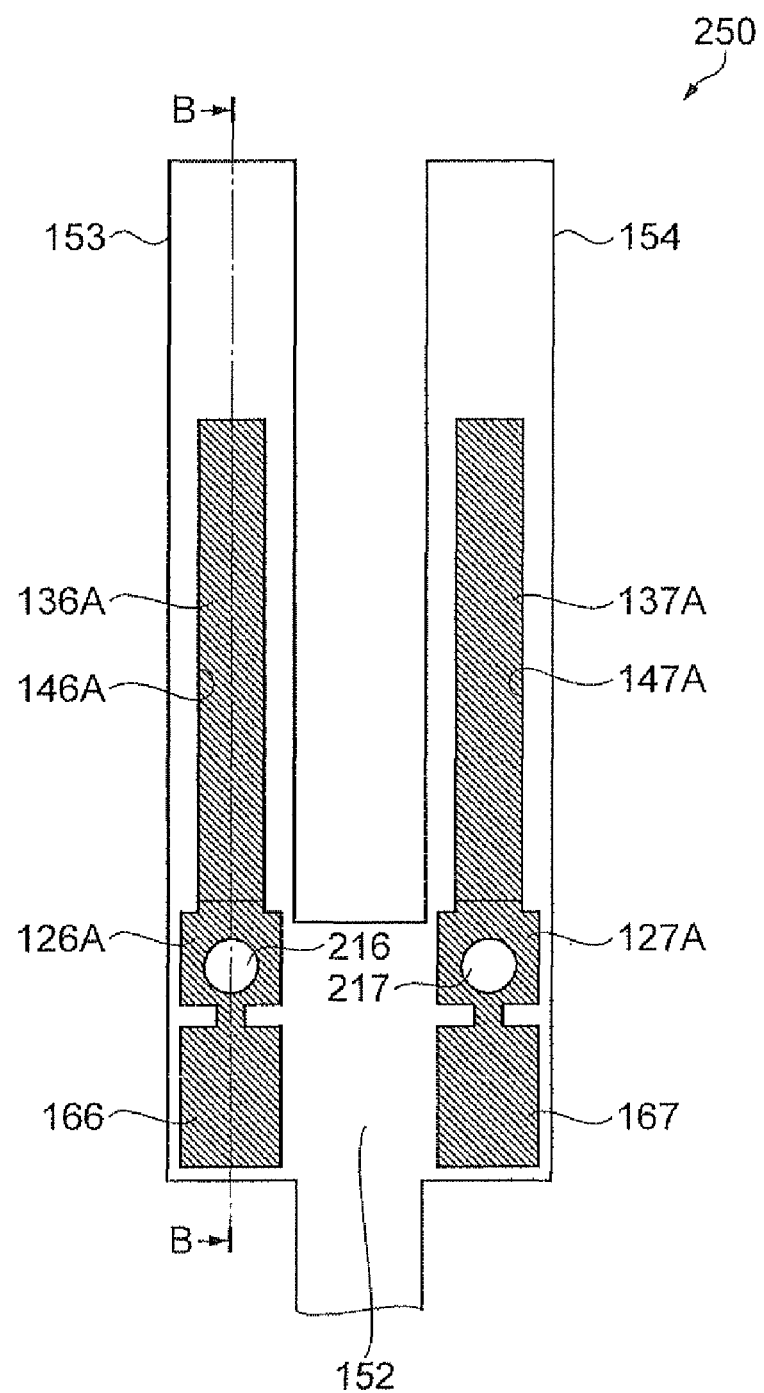
FIG. 7 is a plan view for schematically explaining a tuning fork-type quartz vibration piece of a second modification.
Figure 8:
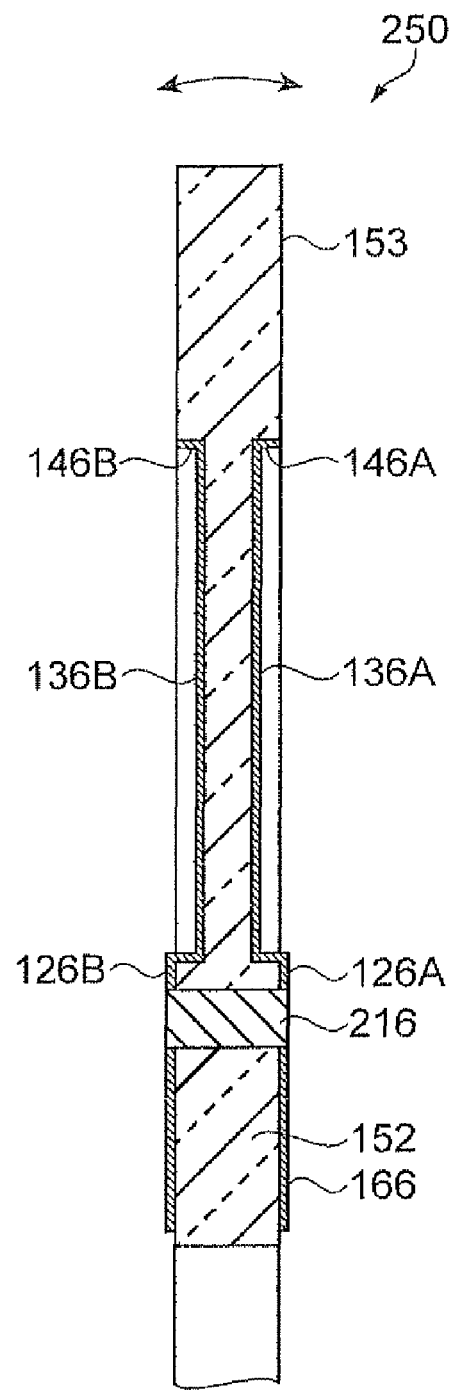
FIG. 8 is a cross-sectional view taken along line B-B in FIG. 7 for schematically explaining the tuning fork-type quartz vibration piece of the second modification.

In the tuning fork-type quartz vibration piece 150 of the first modification, the heat conduction paths 116 and 117 are formed by burying a material having a relatively high thermal conductivity into the through hole that penetrates in the same direction as the flexural vibration direction of the vibration arms 53 and 54, that is, in the same direction as that in which the two vibration arms 53 and 54 are arranged in parallel. This is not restrictive. In the case of a vibration piece that performs flexural vibration in a direction orthogonal to the flexural vibration direction of the vibration arms 53 and 54 of the tuning fork-type quartz vibration pieces 50 and 150 of the embodiment and the first modification, a heat conduction path may be disposed by using a through hole formed in a direction orthogonal to the through hole of the heat conduction paths 116 and 117 of the first modification. FIGS. 7 and 8 schematically explain a tuning fork-type quartz vibration piece of a second modification. FIG. 7 is a plan view of one main surface side. FIG. 8 is a cross-sectional view taken along line B-B in FIG. 7.

In FIG. 7, a tuning fork-type quartz vibration piece 250 of the modification is formed of a base 152 formed of a flexural vibrator material and a pair of vibration arms 153 and 154 bifurcated from one end side of the base 152 and extending in parallel to each other. Grooves 146A and 147A each having a bottom are formed on respective main surfaces of the vibration arms 153 and 154. Excitation electrodes 136A and 137A are formed on the respective surfaces, including the bottom surfaces, of the grooves 146A and 147A. In the vicinity of the other end side of the base 152 different from the one end side from which the vibration arms 153 and 154 are extended, external connection electrodes 166 and 167 are disposed. The external connection electrodes 166 and 167 respectively correspond to the excitation electrodes 136A and 137A. The excitation electrode 136A is connected to the external connection electrode 166 via a relay electrode 126A disposed on the base 152. The excitation electrode 137A is connected to the external connection electrode 167 via a relay electrode 127A disposed on the base 152.

As shown in FIG. 8, a groove 146B having a bottom is formed on a main surface (the other main surface) of the vibration arm 153 on the opposite side. An excitation electrode 136B is formed on the surface, including the bottom surface, of the groove 146B. A relay electrode 126B is formed on the base 152 at a position corresponding to the relay electrode 126A. Similarly, although not shown in the drawing, a groove having a bottom is formed on a main surface of the other vibration arm 154 on the opposite side, an excitation electrode is formed on the surface, including the bottom surface, of the groove, and a relay electrode is formed on the base 152 at a position corresponding to the relay electrode 127A.

In FIG. 8, when a drive voltage is applied to the excitation electrodes 136A and 136B of the tuning fork-type quartz vibration piece 250, the vibration arm 153 performs flexural vibration in a direction indicated by the arrow in the drawing. The flexural vibration direction is orthogonal to the flexural vibration direction of the vibration arms 53 and 54 of the tuning fork-type quartz vibration pieces 50 and 150 of the embodiment and the first modification.

Similarly, although not shown in the drawing, when a drive voltage is applied to the excitation electrode 137A and the excitation electrode as a counter electrode, the vibration arm 154 also performs flexural vibration in the same direction as the vibration arm 153.

That is, in the tuning fork-type quartz vibration piece 250 of the modification, the relay electrodes 126A, 126B, and 127A are disposed in the vicinity of the regions (the first region and the second region) where the increase or decrease in temperature is caused along with the flexural vibration of the vibration arms 153 and 154. In the vicinity of the root portion of the vibration arm 153 at the base 152, a heat conduction path 216 is disposed. The heat conduction path 216 is formed by burying a material having a high thermal conductivity shown in FIG. 4, for example, into a through hole that penetrates in the same direction as the flexural vibration direction of the vibration arm 153. As shown in FIG. 8, the relay electrodes 126A and 126B on both the main surfaces of the vibration arm 153 are thermally connected to each other with the heat conduction path 216.

Similarly, in the vicinity of the root portion of the other vibration arm 154 at the base 152, a heat conduction path 217 is disposed. The heat conduction path 217 is formed by burying a material having a high thermal conductivity into a through hole that penetrates in the same direction as the flexural direction of the vibration arm 154. The relay electrode 127A and the relay electrode facing the relay electrode 127A are thermally connected to each other.

According to the configuration, since the thermal relaxation time τ1 between the regions (the first region and the second region) where the increase or decrease in temperature is caused along with the flexural vibration of the vibration arms 153 and 154 is shortened, an effect of stabilizing the Q value of the tuning fork-type quartz vibration piece 250 is provided.

In the modification, the heat conduction paths 216 and 217 are disposed in the base 152 having a large area compared to the vibration arms 153 and 154. This facilitates the hole making process of the through hole of the heat conduction paths 216 and 217.

In the modification, the heat conduction paths 216 and 217 are disposed in the base 152 for facilitating the hole making process of the through hole. However, the heat conduction path may be disposed in the vicinity of the roots of the respective vibration arms 153 and 154 at the base 152. In this case, the heat conduction path that thermally connects between the regions (the first region and the second region) where the increase or decrease in temperature is caused along with the flexural vibration of the vibration arms 153 and 154 is further shortened, and therefore the Q value can be further stabilized.

Oscillator

The tuning fork-type quartz vibration pieces 50, 150, and 250 as flexural vibration pieces described in the embodiment and the modifications can be applied to piezoelectric devices or various electronic components other than piezoelectric devices. Especially an oscillator configured by at least incorporating into a package, together with any flexural vibration piece of the tuning fork-type quartz vibration pieces 50, 150, and 250, an oscillator circuit element that oscillates the flexural vibration piece can realize high performance because of an improvement in Q value and can achieve miniaturization.

Although the embodiment of the invention made by the inventor has been specifically described so far, the invention is not restricted to the above-described embodiment. Various changes can be added in a range not departing from the gist of the invention.

For example, in the tuning fork-type quartz vibration piece 50 of the embodiment, the heat conduction path 56 or 57 is disposed on one of main surface sides in each of the vibration arms 53 and 54. However, this is not restrictive. For example, when the heat conduction path is disposed on both main surfaces of each of the vibration arms, the heat conduction from the first regions 110 and 112 to the second regions 111 and 113 of the vibration arms 53 and 54 is more efficiently performed. Therefore, an effect of suppressing a reduction in Q value can be improved. In this case, parts of the routing wires 56A and 57A are not used as the heat conduction paths 56 and 57 unlike the embodiment, but a heat conduction path that is electrically independent of the routing wire is disposed on both main surfaces of the vibration arms, whereby the first region and the second region are connected to each other with the two heat conduction paths.

In the tuning fork-type quartz vibration pieces 150 and 250 of the first and second modifications, the heat conduction paths 116 and 117 or the heat conduction paths 216 and 217 formed of a through hole and a material having a high thermal conductivity buried into the through hole have been described. The penetrating direction of the through hole of the heat conduction paths 116 and 117 or the heat conduction paths 216 and 217 can be a direction orthogonal to the penetrating direction with respect to the vibration direction of the vibration arms 53 and 54 or the vibration arms 153 and 154.

For example, the heat conduction path can be used also as an inter-layer wire that connects corresponding electrodes to each other on both the main surfaces of the vibration arms 53 and 54 or the vibration arms 153 and 154.

The embodiment and the modifications have described the tuning fork-type quartz vibration pieces 50, 150, and 250 as flexural vibration pieces. This is not restrictive. The flexural vibration piece of the invention may be a so-called beam type flexural vibration piece having a reed shape. Moreover, even when a flexural vibration piece having three or more vibration arms can provide the same effect as in the embodiment and the modifications.

Figure 9A:
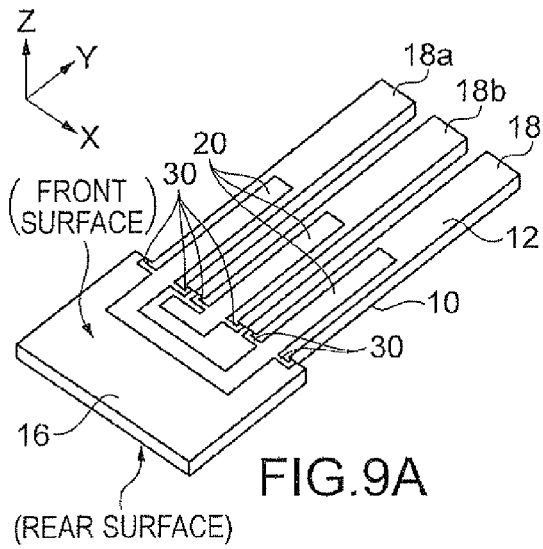
FIG. 9A is a perspective view for schematically showing a flexural vibration piece having three vibration arms and showing a process of electrode formation.
Figure 9D:
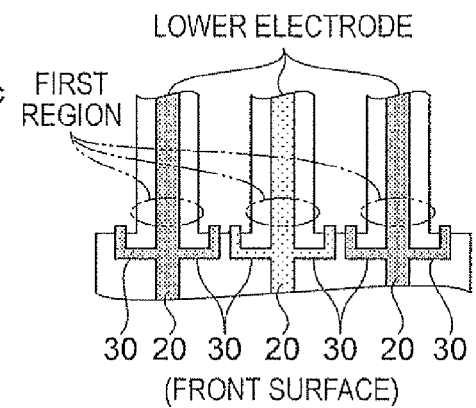
FIG. 9D is an enlarged view of the front surface around the connection of a base and the vibration arms in FIG. 9A.
Figure 9B:
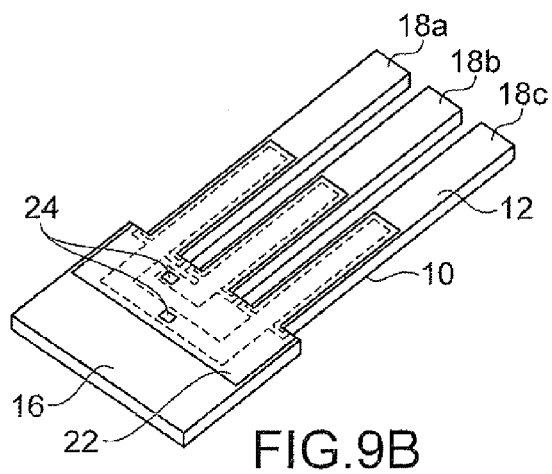
FIG. 9B is a perspective view for schematically showing the flexural vibration piece and showing a process of electrode formation.
Figure 9E:
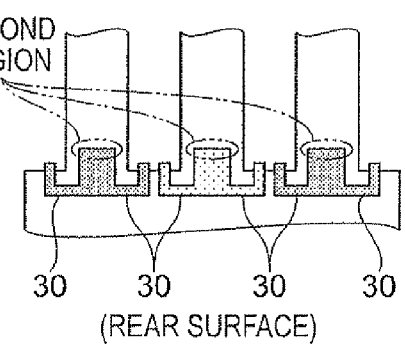
FIG. 9E is an enlarged view (transparent view from the upper surface) of the rear surface around the connection of the base and the vibration arms in FIG. 9A.
Figure 9C:
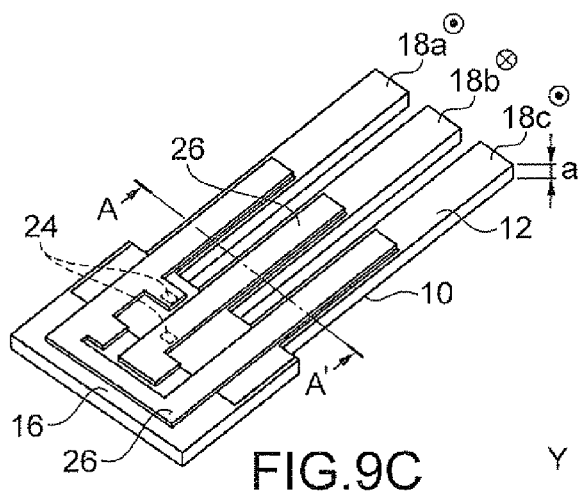
FIG. 9C is a perspective view for schematically showing the flexural vibration piece and showing a process of electrode formation.
Figure 9F:
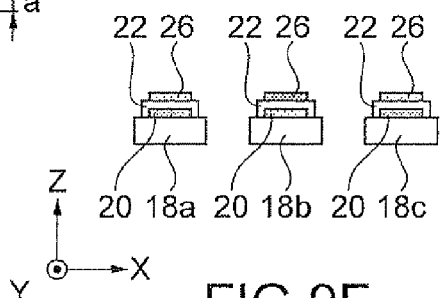
FIG. 9F is a cross-sectional view taken along line A-A' in FIG. 9C.
Figure 10:
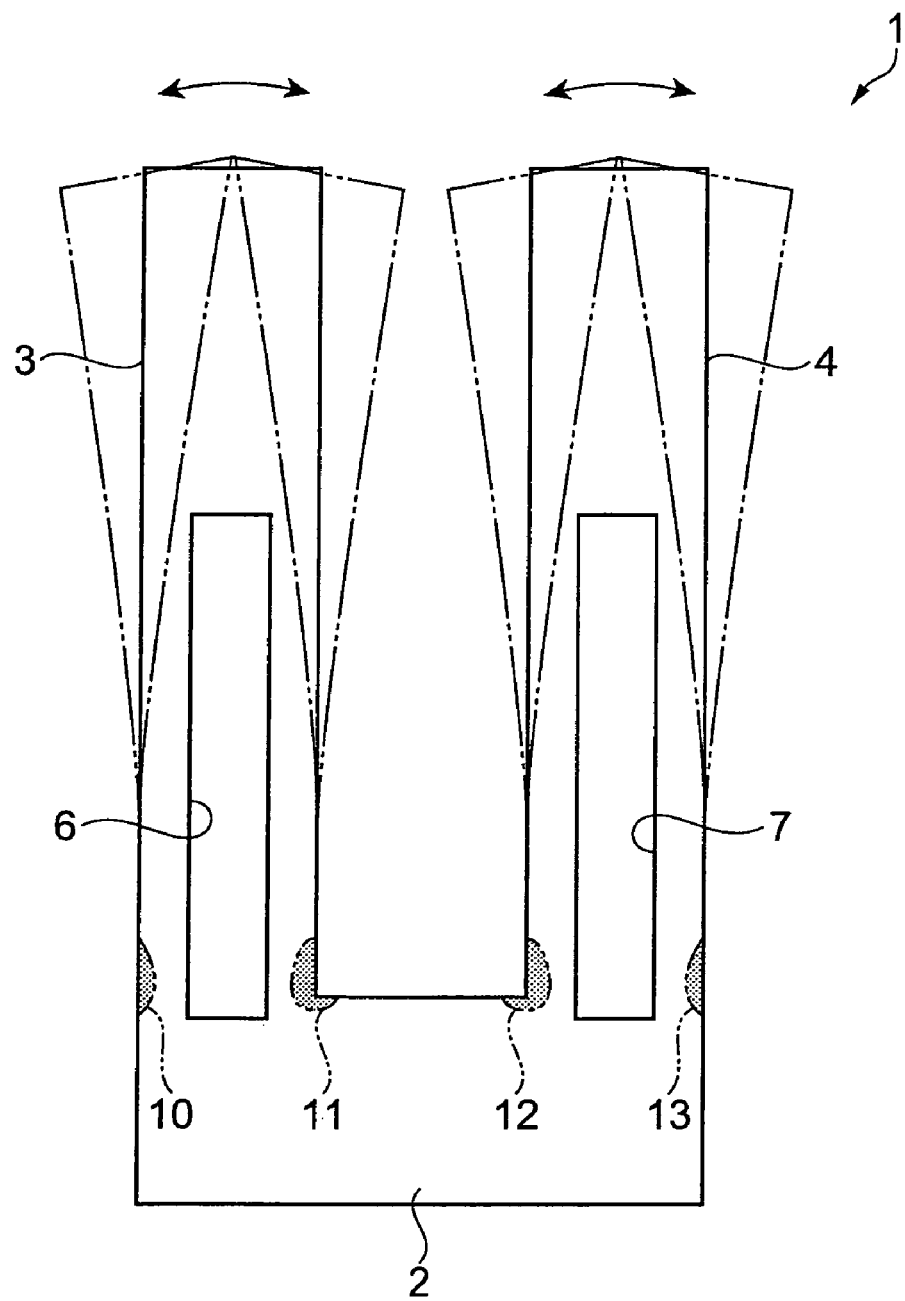
FIG. 10 is a plan view showing a typical example of a related-art tuning fork-type quartz vibration piece.

A specific example of a flexural vibration piece having three or more vibration arms will be described below. FIGS. 9A to 9F schematically show a flexural vibration piece having three vibration arms. FIGS. 9A to 9C show the process of electrode formation. FIG. 9D is an enlarged view of the front surface around the connection of a base and the vibration arms in FIG. 9A. FIG. 9E is an enlarged view (transparent view from the upper surface) of the rear surface around the connection of the base and the vibration arms in FIG. 9A. FIG. 9F shows a cross-sectional view taken along line A-A' in FIG. 9C.

As shown in FIGS. 9A to 9F, a piezoelectric element 10 includes a base 16 formed of a quartz substrate and three vibration arms 18a, 18b, and 18c extending from one end of the base. The vibration arms 18a, 18b, and 18c include a lower electrode 20 arranged on a main surface 12, a piezoelectric film 22 arranged on the lower electrode 20, and an upper electrode 26 arranged on the piezoelectric film 22. The vibration arms 18a and 18c and the vibration arm 18b alternately perform flexural vibration vertically. In other words, it can be said that they perform flexural vibration in a direction orthogonal to a plane on which the base 16 and the vibration arms 18a, 18b, and 18c are formed. A width a of the vibration arm of this example in a vibration direction is a thickness direction of the vibration arm. As shown in FIG. 9A in this example, the lower electrode 20 is first formed on the surface of the vibration arms 18a, 18b, and 18c. As shown in FIG. 9B, the piezoelectric film 22 is formed so as to cover parts of the lower electrode 20 and the base 16, and openings 24 for continuity connection between the lower electrode 20 and the upper electrode 26 are formed. As shown in FIG. 9C, the upper electrode 26 is formed on the piezoelectric film 22. FIG. 9F shows a cross-sectional view taken along line A-A' in FIG. 9C. The lower electrode, the piezoelectric film, and the upper electrode are stacked on the quartz substrate to form an electrode. In this case, the lower electrode 20 of the vibration arms 18a and 18c and the upper electrode 26 of the vibration arm 18b are connected to each other, and the upper electrode of the vibration arms 18a and 18c and the lower electrode 20 of the vibration arm 18b are connected to each other. In this example, the lower electrode 20 is formed of an electrode material having a thermal conductivity higher than that of a quartz substrate.

Due to the flexural vibration, in the connections between the base 16 and the vibration arms 18a, 18b, and 18c, a compressive stress and a tensile stress occur on the front and rear surfaces of the vibration arms 18a, 18b, and 18c in the root portions in the vibration direction. Description will be made in detail on the vibration arms in the drawing. When the vibration arms 18a and 18c perform flexural vibration in the +Z-axis direction, a compressive stress acts on a first region on the front surface of the vibration arms 18a and 18c to increase temperature, and a tensile stress acts on a second region on the rear surface to decrease temperature. On the other hand, the vibration arm 18b performs flexural vibration in the −Z-axis direction. A tensile stress acts on the first region on the front surface of the vibration arm 18b to decrease temperature, and a compressive stress acts on the second region on the rear surface to increase temperature. In this manner, inside the connections of the respective vibration arms 18a, 18b, and 18c with the base 16, a temperature gradient is generated between the portion on which a compressive stress acts and the portion on which a tensile stress acts. The gradient changes in direction depending on the vibration direction of the vibration arms 18a, 18b, and 18c. Due to the temperature gradient, heat conducts from the portion on the compression side to the portion on the tensile side, that is, from the high-temperature side to the low-temperature side.

In the tuning fork-type quartz vibration piece of this example, a heat conduction path 30 is extended from side surfaces of each of the lower electrodes 20 around the connections between the respective vibration arms 18a, 18b, and 18c and the base 16 as shown in FIG. 9D, and the heat conduction path 30 is formed so as to overlap the second region on the rear surface as shown in FIG. 9E. Therefore, the time for heat conduction from the compression side to the tensile side is faster than in a structure in which the heat conduction path 30 is not disposed. Although the lower electrode is used as the heat conduction path in this example, the piezoelectric film or the upper electrode may be used as the heat conduction path.

Although the embodiment and the modifications have described the tuning fork-type quartz vibration pieces 50, 150, and 250 formed of quartz as an example of flexural vibration piece, the tuning fork-type quartz vibration piece may be a flexural vibration piece formed of a piezoelectric substrate other than a quartz substrate. For example, an oxide substrate such as of aluminum nitride (AlN), lithium niobate (LiNbO$_3$), lithium tantalate (LiTaO$_3$), lead zirconate titanate (PZT), or lithium tetraborate (Li$_2$B$_4$O$_7$) and a piezoelectric substrate configured by stacking a thin-film piezoelectric material such as aluminum nitride or tantalum pentoxide (Ta$_2$O$_5$) on a glass substrate can be used. Moreover, a silicon semiconductor can be used as the material of the flexural vibration piece in addition to a piezoelectric material.

The base material of a flexural vibration piece is not restricted to a piezoelectric substrate. The configuration and effect of the invention can be achieved not only in a piezoelectrically-actuated flexural vibration piece using a piezoelectric substrate but also in an electrostatically-actuated flexural vibration piece using static electricity force or a magnetically-actuated flexural vibration piece using magnetism.

The entire disclosure of Japanese Patent Application No. 2009-073740, filed Mar. 25, 2009 and No. 2010-002670, filed Jan. 8, 2010 are expressly incorporated by reference herein.

What is claimed is:

1. A flexural vibration piece comprising:
    a flexural vibrator that has a first region on which a compressive stress or a tensile stress acts due to vibration and a second region having a relationship in which a tensile stress acts thereon when a compressive stress acts on the first region and a compressive stress acts thereon when a tensile stress acts on the first region, and performs flexural vibration in a first plane; and
    a heat conduction path, in the vicinity of the first region and the second region, that is formed of a material having a thermal conductivity higher than that of the flexural vibrator and thermally connects between the first region and the second region, wherein
    when m is the number of heat conduction paths, $\alpha_{th}$ is the thermal conductivity of the heat conduction path, $\alpha_v$ is the thermal conductivity of the flexural vibrator, $t_v$ is the thickness of the flexural vibrator in a direction orthogonal to the first plane, and $t_{th}$ is the thickness of the heat conduction path, a relationship of $t_{th} \geq (t_v/m) \times (\alpha_v/\alpha_{th})$ is satisfied.

2. The flexural vibration piece according to claim 1, wherein
    the flexural vibrator is formed so as to extend from one end of a base, and the heat conduction path is formed so as to pass over the base near the root of the flexural vibrator at the base.

3. The flexural vibration piece according to claim 2, wherein
    a first electrode is formed in at least part of the first region, a second electrode is formed in at least part of the second region, and the heat conduction path is connected to the first electrode and the second electrode.

4. The flexural vibration piece according to claim 1, wherein
    when $l_{th}$ is the length of the heat conduction path, and $l_v$ is the distance between the first region and the second region of the flexural vibrator, a relationship of $t_{th} \geq (t_v/m) \times (\alpha_v/\alpha_{th}) \times (l_{th}/l_v)$ is satisfied.

5. The flexural vibration piece according to claim 1, wherein
    when fr is a mechanical oscillation frequency of the flexural vibrator, $f_{20}$ is a thermal relaxation frequency of the flexural vibration piece, π is a ratio of the circumference of a circle to its diameter, k is a thermal conductivity of a material used for the flexural vibrator in a vibration direction, ρ is a mass density of a material used for the flexural vibrator, $C_p$ is a heat capacity of the material used for the flexural vibrator, a is a width of the flexural vibrator in the vibration direction, and $f_0 = \pi k/(2\rho C_p a^2)$, a relationship of $1 > fr/(f_0 + (f_{20} - f_0)/3)$ is satisfied.

6. The flexural vibration piece according to claim 1, wherein
    when fr is a mechanical oscillation frequency of the flexural vibrator, π is a ratio of the circumference of a circle to its diameter, k is a thermal conductivity of a material used for the flexural vibrator in a vibration direction, ρ is a mass density of a material used for the flexural vibrator, $C_p$ is a heat capacity of the material used for the flexural vibrator, a is a width of the flexural vibrator in the vibration direction, and $f_0 = \pi k/(2\rho C_p a^2)$, a relationship of $1 \geq fr/f_0$ is satisfied.

7. The flexural vibration piece according to claim 1, wherein
    when $\tau_0$ is a thermal relaxation time required for a temperature between the first region and the second region reaching a state of equilibrium in the case where the heat conduction path is not disposed, and $\tau_1$ is the thermal relaxation time in the case where the heat conduction path is disposed, a relationship of $\tau_1 < \tau_0$ is satisfied.

8. The flexural vibration piece according to claim 1, wherein
    all or a part of the heat conduction path is formed by burying a material having a thermal conductivity higher than that of the flexural vibrator into a through hole that penetrates from the first region to the second region of the flexural vibrator or a through hole that penetrates in the vicinity of the first region and the second region.

9. An oscillator at least comprising:
    the flexural vibration piece according to claim 1; and
    an oscillator circuit that drives the flexural vibration piece.

* * * * *